US009922893B2

United States Patent
Takamura

(10) Patent No.: US 9,922,893 B2
(45) Date of Patent: Mar. 20, 2018

(54) SEMICONDUCTOR MODULE

(71) Applicant: SANSHA ELECTRIC MANUFACTURING CO., LTD., Osaka (JP)

(72) Inventor: Akio Takamura, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 0 days.

(21) Appl. No.: 15/510,517

(22) PCT Filed: Sep. 16, 2015

(86) PCT No.: PCT/JP2015/076226
§ 371 (c)(1),
(2) Date: Mar. 10, 2017

(87) PCT Pub. No.: WO2016/052183
PCT Pub. Date: Apr. 7, 2016

(65) Prior Publication Data
US 2017/0301594 A1 Oct. 19, 2017

(30) Foreign Application Priority Data

Sep. 30, 2014 (JP) ................. 2014-201847
Nov. 5, 2014 (JP) ................. 2014-225322
(Continued)

(51) Int. Cl.
*H01L 23/049* (2006.01)
*H01L 23/492* (2006.01)
(Continued)

(52) U.S. Cl.
CPC ............ *H01L 23/049* (2013.01); *H01L 23/08* (2013.01); *H01L 23/10* (2013.01); *H01L 23/24* (2013.01);
(Continued)

(58) Field of Classification Search
CPC ... H01L 23/041; H01L 23/043; H01L 23/049; H01L 23/053; H01L 25/0655
See application file for complete search history.

(56) References Cited

U.S. PATENT DOCUMENTS 5,408,128 A * 4/1995 Furnival ........... H01L 23/49811
257/690
8,933,554 B2 * 1/2015 Kodaira ................ H01L 23/34
257/584

(Continued)

FOREIGN PATENT DOCUMENTS

JP 03-178156 A 8/1991
JP 05-160339 A 6/1993
(Continued)

OTHER PUBLICATIONS

International Search Report for corresponding International Application No. PCT/JP2015/076226 dated Dec. 15, 2015.

*Primary Examiner* — David Zarneke
(74) *Attorney, Agent, or Firm* — Renner Otto Boisselle & Sklar, LLP

(57) ABSTRACT

A semiconductor module includes a rectangular base plate; a substrate which is placed on the base plate and on which a circuit including a semiconductor chip and so forth is formed; a rectangular parallelepiped case made of resin that is attached to the base plate and houses the substrate within; and a plurality of external terminals lower ends of which are fixed to the substrate with upper ends thereof being exposed on a top face of the case. The case is provided with a first case opening portion and a second case opening portion that
(Continued)

are respectively formed by cutting off a front face and a rear face of the case from an upper edge thereof along a longitudinal direction thereof; and the top face of the case between the first case opening portion and the second case opening portion includes an external terminal holding portion to hold the plurality of external terminals along the longitudinal direction with the upper ends thereof being exposed. A sealing material is injected from the first case opening portion and the second case opening portion onto a top face of the substrate, and thereby the semiconductor module is sealed.

20 Claims, 7 Drawing Sheets

(30) Foreign Application Priority Data

Nov. 14, 2014 (JP) .................................. 2014-231297
Nov. 14, 2014 (JP) .................................. 2014-231298

(51) Int. Cl.
| | | |
|---|---|---|
| *H01L 23/08* | (2006.01) | |
| *H01L 23/24* | (2006.01) | |
| *H01L 23/00* | (2006.01) | |
| *H01L 23/10* | (2006.01) | |
| *H01L 25/07* | (2006.01) | |
| *H01L 23/04* | (2006.01) | |
| *H01L 23/053* | (2006.01) | |
| *H01L 25/065* | (2006.01) | |
| *H01L 23/043* | (2006.01) | |

(52) U.S. Cl.
CPC .......... *H01L 23/492* (2013.01); *H01L 23/562* (2013.01); *H01L 25/072* (2013.01); *H01L 23/041* (2013.01); *H01L 23/043* (2013.01); *H01L 23/053* (2013.01); *H01L 25/0655* (2013.01)

(56) References Cited

U.S. PATENT DOCUMENTS

2011/0273861 A1* 11/2011 Matsumoto ............. H01L 23/04
361/820
2013/0285231 A1 10/2013 Kodaira
2014/0210067 A1* 7/2014 Takamiya ......... H01L 23/49811
257/698
2014/0361424 A1 12/2014 Horio et al.

FOREIGN PATENT DOCUMENTS

JP 2008-294362 A 12/2008
WO WO 2013/015031 A1 1/2013
WO WO 2013/145620 A1 10/2013

* cited by examiner

SEMICONDUCTOR MODULE

TECHNICAL FIELD

The present invention relates to a semiconductor module produced by housing a substrate, on which a power semiconductor chip such as thyristor, transistor and/or the like is mounted, in a case made of resin and then sealing inside of the case with a gel material and/or epoxy resin.

BACKGROUND ART

A process for producing a semiconductor module by housing a substrate, on which a power semiconductor chip is mounted, in a case made of resin and then sealing inside of the case with a gel material and/or epoxy resin includes the following steps.

That is, the process includes: a step of implementing, by reflow soldering, a semiconductor chip and/or the like on a substrate that is placed on a base; a step of joining and fixing together a case and the base plate that have been adjusted in position to each other; a step of injecting silicone gel and/or epoxy resin into the case and thermally curing the gel or resin; a step of inserting an external terminal into the case and bending the terminal, and so forth. Then, after each step is completed, a visual inspection is performed.

As for shapes of the case, there have been proposed various ones. For example, in Patent Literature 1, there is proposed one consisting of a case main body an upper part of which is entirely open, and a lid which covers the upper part opening portion of the case main body and to which the external terminal is attached. In a method of producing a module having this case structure, when an internal circuit is soldered using a reflow soldering process in a state where the case main body and the lid are put together in position on a substrate, the case main body and the lid are joined together at the same time. Also, in Patent Literature 2, there is proposed one consisting of a case main body a top face of which is open, and a lid which covers the opening portion of the case main body and in which a hole portion into which an external terminal extending upward from a substrate is inserted is formed. In a method of producing a module having this case structure, an internal circuit is soldered by a reflow soldering process in a state where the case main body and the external terminal are fixed using a jig; subsequently, silicone gel and/or epoxy resin is injected into the case main body and thermally cured; thereafter, the external terminal is inserted into the hole portion of the lid and the lid is fixed; and finally, the external terminal is bent.

CITATION LIST

Patent Literature

Patent Literature 1: Japanese Unexamined Patent Application Publication No. 5-160339 Bulletin
Patent Literature 2: Japanese Unexamined Patent Application Publication No. 3-178156 Bulletin

SUMMARY OF INVENTION

Technical Problem

However, in the semiconductor module shown in the above-mentioned Patent Literature 1, since the reflow soldering is performed in the state where the case main body and the lid are put together in position on the substrate, it is impossible to see the inside of the case from outside after the reflow soldering process. As a result, it is almost impossible to perform a visual inspection of the soldering after the reflow soldering process.

Also, in the semiconductor module shown in the above-mentioned Patent Literature 2, while it is easy to perform a visual inspection of the soldering after the reflow soldering process since the upper part of the case main body is open, workability is not good enough since it is necessary to perform the reflow soldering with the external terminal being fixed using the jig. Moreover, high accuracy of mounting position of the external terminal is required since the lid is put on in a state where the external terminal is fixed on the substrate. That is, if the external terminal gets a little out of position during the reflow soldering process, it may happen that the external terminal cannot be inserted into the hole portion of the lid, or that a joint between the external terminal and the circuit separates and/or causes contact failure due to a large stress generated when the terminal is bent.

Further, in the semiconductor module shown in the above-mentioned Patent Literature 1, since the reflow soldering is performed in the state where the case main body and the lid to which the external terminal is attached are put together in position on the substrate, high mounting accuracy is required between each component of the substrate, the case main body and the external terminal. If the mounting accuracy between these components is not good enough, it may happen at the time of reflow soldering that a soldering portion of the external terminal is unable to be entirely soldered to the substrate, or that the soldering portion overly presses the substrate to cause the formation of a crack in the circuit.

Also, in the semiconductor module shown in the above-mentioned Patent Literature 2, high accuracy of mounting position of the external terminal is required since the lid is put on in the state where the external terminal is fixed on the substrate. That is, if the external terminal gets a little out of position at the time of reflow soldering process, it may happen that the external terminal cannot be inserted into the hole portion of the lid, or that a joint between the external terminal and the circuit separates and/or causes a contact failure due to a large stress generated when the terminal is bent.

Further, in the semiconductor module shown in the above-mentioned Patent Literature 1, since the reflow soldering is performed in the state where the case main body and the lid to which the external terminal is attached are put together in position on the substrate, it is difficult or impossible to seal a volume over the substrate with silicone gel and/or epoxy resin. As a result, there is a problem that temporal degradation of insulation properties occurs.

Also, in the semiconductor module shown in the above-mentioned Patent Literature 2, while it is possible to seal the volume over the substrate with silicone gel and/or epoxy resin after the reflow soldering, the module is not of structure that makes it possible to evade the expansion of the sealing material itself that arises from a thermal stress applied thereto when the module is in use. As a result, in the course of repeated expansion and shrinkage of the sealing material itself, there is a possibility that an interface between the sealing material and the substrate detaches, or that a crack occurs in the epoxy resin on the sealing material.

It is a purpose of the present invention to provide a semiconductor module that makes it possible to easily perform visual observation of soldering, and to perform a reflow soldering process in a state where an external terminal is attached to a case.

It is another purpose of the present invention to provide a semiconductor module that ensures high mounting accuracy at the time of soldering of the external terminal.

It is another purpose of the present invention to provide a semiconductor module that can absorb even such physical changes that occur when a sealing material that seals a volume over a substrate repeats expansion and shrinkage due to a thermal stress. Further, it is another purpose of the present invention to provide a semiconductor module that prevents curing inhibition of the sealing material that can arise from a cleaning agent remaining from a cleaning after the reflow soldering.

Solution to Problem

A semiconductor module of the present invention includes: a rectangular base plate; a substrate such as ceramic substrate which is placed on the base plate and on which a circuit that includes a driving terminal, for example a gate terminal, to drive a semiconductor chip and the semiconductor chip is formed; a rectangular parallelepiped case made of resin that is attached to the base plate and houses the substrate within; and a plurality of external terminals lower ends of which are fixed to the substrate with upper ends thereof being exposed on a top face of the case.

The semiconductor chip is, for example, a chip for thyristor, diode or transistor for power control.

The case is formed of a resin material such as PPS (polyphenylene sulfide).

The case further includes:
a first case opening portion that is formed by cutting off a front face of the case from an upper edge thereof along a longitudinal direction thereof;
a second case opening portion that is formed by cutting off a rear face of the case from an upper edge thereof along the longitudinal direction; and
an external terminal holding portion that is provided in the top face of the case between the first case opening portion and the second case opening portion and holds the plurality of external terminals along the longitudinal direction with the upper ends thereof being exposed.

Before the case is attached to the base plate, the plurality of external terminals are kept being held by the external terminal holding portion. This enables the external terminals to be mounted on the substrate on the base at the same time when the case is attached to the base plate. Also, thanks to the existence of the first case opening portion and the second case opening portion, it is possible to easily see, after the reflow soldering process, a state of soldering on the substrate that is inside the case from these case opening portions. Since the first case opening portion is disposed in the front face of the case and the second opening portion is disposed in the rear face of the case, sufficient amount of light enters from the front face and the rear face of the case onto the substrate inside the case when visual inspection is performed. Therefore, visual inspection of the state of soldering is easily performed.

Moreover, the case is divided into three rooms consisting of a central room in which a substrate on which a semiconductor chip and/or the like which is an important component that influences the performance of the module is mounted is disposed, a stress absorption room, and a driving terminal room in which a driving terminal to drive the semiconductor chip is routed. Since the case is divided into the respective rooms, if by chance dust and/or the like enters into the stress absorption room and/or the driving terminal room, its influence on the central room can be prevented. Further, forming the first case opening portion, the second case opening portion and the external terminal holding portion in this central room results in having inside of the case open from outside only at a section for which visual inspection is required in the production process, so that production can be carried out in a state where the stress absorption room and the driving terminal room for which visual inspection is not required are covered with the case.

Also, because sealing materials, for example, gel such as silicone gel and resin are respectively injected from the case opening portions onto an upper face of the substrate, respective injections are easily carried out thanks to large areas available for the injection. Sealing a volume over the substrate in this manner ensures that the base plate and the substrate are kept from being exposed to outside, thereby making it possible to preserve quality. Here, for the sealing material, either one of gel and resin, or both of them can be used respectively.

A preferred embodiment of the present invention further includes a lid body.

The lid body includes a top face in which a terminal lead-out portion from which the plurality of the external terminals are each exposed over the top face is formed; and a cover that covers each of the case opening portions in the front face and the rear face from the top face downward.

Since the case opening portions are covered by the lid body, the external terminal holding portion is reinforced, and also dust and/or dirt can be prevented from entering into the inside from the case opening portions. Covering the case opening portions by the lid body even in the case where the volume over the substrate is sealed by the sealing material can improve the strength of the external terminal holding portion, and by extension the strength of the semiconductor module.

The lid body can include, at a lower part of the cover, a leg portion that reaches the sealing material, and with such a leg portion the lid body can be fixed to the case with the leg portion being fixed in a sealing material curing process.

In another embodiment of the present invention,
the external terminal includes a first vertical section provided between the upper end and the lower end;
the external terminal holding portion includes a first vertical section holding portion that restrains the first vertical section of the external terminal from moving in horizontal directions and slidingly guide thereof in vertical direction; and
the external terminal, in a state before the case is attached to the base plate, is movable in vertical direction and is restrained from moving in horizontal directions through the external terminal holding portion.

With the above configuration, the external terminal is held by the external terminal holding section before the soldering process. At this time, the external terminal is movable in vertical direction and is restrained from moving in horizontal directions through the external terminal holding portion. Therefore, before the soldering, a soldering portion at a lower end of the external terminal is in contact with a top face of a circuit of the substrate via a solder paste, and the external terminal is in a state of being lifted by an amount of a thickness of the solder paste. At this time, the external terminal is free from any force applied along upward or downward direction. Also, in horizontal directions, movement is restrained so that positional shift of the external terminal may not occur. Subsequently, in the soldering process (reflow soldering), the solder paste melts, thereby the external terminal descends by its own weight, and then the soldering portion at the lower end is soldered onto the circuit.

In this manner, since soldering is carried out harnessing the descending motion by its own weight with the external terminal being kept in a free state in the upward and downward directions, no unnecessary force is applied to the external terminal at the time of soldering. Also, because the external terminal can be bent before soldering, there is no possibility that internal stress is generated at the time of soldering; and also, bending of the external terminal is easy because it can be carried out alone. Performing the soldering harnessing the free fall of the external terminal ensures that the soldering portion at the lower end of the external terminal is soldered with a circuit on the substrate, and also eliminates any possibility of occurrence of a damage and/or a contact failure caused by a large stress generated at a joint between the lower end and the circuit (such as semiconductor chip).

In a preferred embodiment of the present invention, the external terminal has a narrow width portion which is formed continuously next to the first vertical section and a width of which is narrower than a width of the first vertical section;

the first vertical section holding portion has an insertion port formed by opening a face of a through hole, and a plurality of first guide grooves formed on both left and right sides of the insertion port; and a width between the plurality of the first guide grooves has a width between which the first vertical section of the external terminal can be slidingly guided, and a width of the insertion port has a width that is narrower than the width of the first vertical section but not narrower than that of the narrow width portion.

When the external terminal is attached, the first vertical section is moved downward while being introduced into the first guide grooves. At this time, since the narrow portion is narrower than the width of the insertion port, the external terminal as a whole can move downward even when the narrow width portion is in a state of being bent from the vertical section. Thus, the external terminal can be bent beforehand.

In another preferred embodiment of the present invention, the external terminal includes a rectangular hole in a horizontal section formed with the first vertical section being bent, and the external terminal holding portion includes a rectangular protrusion inside the case; and the rectangular protrusion engages with the rectangular hole when the first vertical section of the external terminal is inserted into the vertical section holding portion, and thereby the external terminal is held by the external terminal holding portion.

As in the above configuration, engaging the rectangular hole of the external terminal with the rectangular protrusion inside the case ensures that the external terminal is fixed to the case.

In another embodiment of the present invention, the case includes:

a first partition wall formed in vertical direction inside the case; and a central room and a stress absorption room divided by the first partition wall, wherein the substrate is disposed in the central room; and the stress absorption room includes a space portion not less than an amount of a volume expansion caused by a thermal stress of the sealing material, and a small hole that is provided at an upper part and communicably connected to outside.

The reason for providing the stress absorption room is as follows:

Because the sealing material, for example, a gel such as silicone gel, repeats expansion and shrinkage due to the thermal stress received from the semiconductor chip and/or substrate under normal use, it is necessary to provide beforehand a space portion to absorb the volume change. The stress absorption room provides this function.

Also, the reason that the stress absorption room includes a small hole that is communicably connected to outside is as follows:

The small hole discharges a gas that is generated when the sealing material undergoes the thermal curing to outside completely. Because there is no gas remaining, temporal property degradation of wall faces inside the stress absorption room no longer occurs. Also, because a cleaning liquid can pass through the small hole at the time of cleaning after the reflow soldering, circulation inside the case at the time of cleaning is improved, so that there remains no cleaning liquid inside the stress absorption room. As a result, the curing inhibition phenomenon by which thermal curing of the sealing material is hindered due to the remaining cleaning liquid can be prevented. Further, since the circulation inside the case at the time of cleaning is improved, cleaning performance for the substrate improves.

Advantageous Effects of Invention

With an external terminal kept being held by an external terminal holding portion before a case is joined to a base plate, the present invention enables the external terminal to be mounted on the substrate on the base at the same time when the case is attached to the base plate. Also, thanks to the existence of a first case opening portion and a second case opening portion, it is possible to easily see, after a reflow soldering process, a state of soldering on the substrate that is inside the case from these case opening portions. Since these case opening portions are disposed in a front face and a rear face of the case, sufficient amount of light enters from the front face and the rear face onto the substrate when visual inspection is performed. As a result, it is possible to take the light sufficiently into the case, and thereby visual inspection of the state of soldering can be performed.

Besides, because as sealing materials, for example, either or both of gel such as silicone gel and resin are injected from these case opening portions onto an upper face of the substrate, respective injections are easily carried out and workability thereof is excellent thanks to large areas available for the injection.

Also, with the present invention, since soldering can be performed harnessing descending motion by its own weight, no internal stress is generated in the external terminal. Further, the invention ensures that the soldering portion at a lower end of the external terminal is soldered with a circuit on the substrate, and also eliminates any possibility of occurrence of detachment and/or a contact failure caused by a large stress generated at a joint between the lower end and the circuit.

Moreover, with the present invention, since a stress absorption room having a space portion not less than an amount of a volume expansion caused by a thermal stress of the sealing material, a volume change caused by the thermal stress of the sealing material is absorbed in the stress absorption room. Also, since a small hole that is communicably connected to outside is formed at an upper part of the stress absorption room, a gas generated when the sealing material undergoes thermal curing is discharged outside completely. This ensures that an interface between the substrate and the sealing material located in the central room maintains a physically stable state, and adverse effect of the remaining gas on physical change of the wall faces of the stress absorption room no longer remains to exist. Additionally, since a cleaning liquid used at the time of cleaning after the reflow soldering is drained outside from the small hole, the curing inhibition of the sealing material resulting from remaining cleaning liquid can be prevented from occurring.

DESCRIPTION OF EMBODIMENTS

Figure 1:
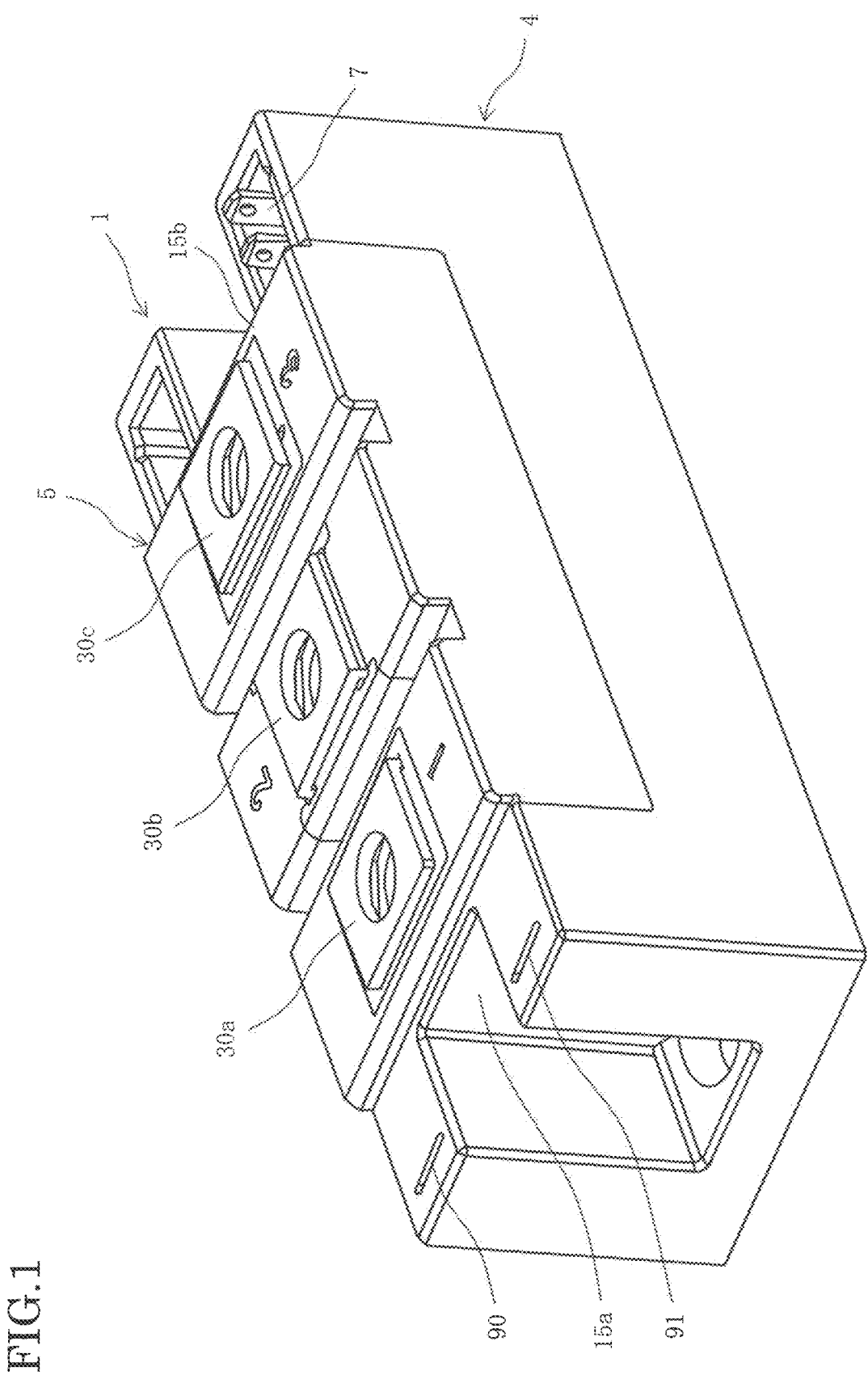
FIG. 1 is a perspective view of a semiconductor module according to an embodiment of the present invention.
Figure 2:
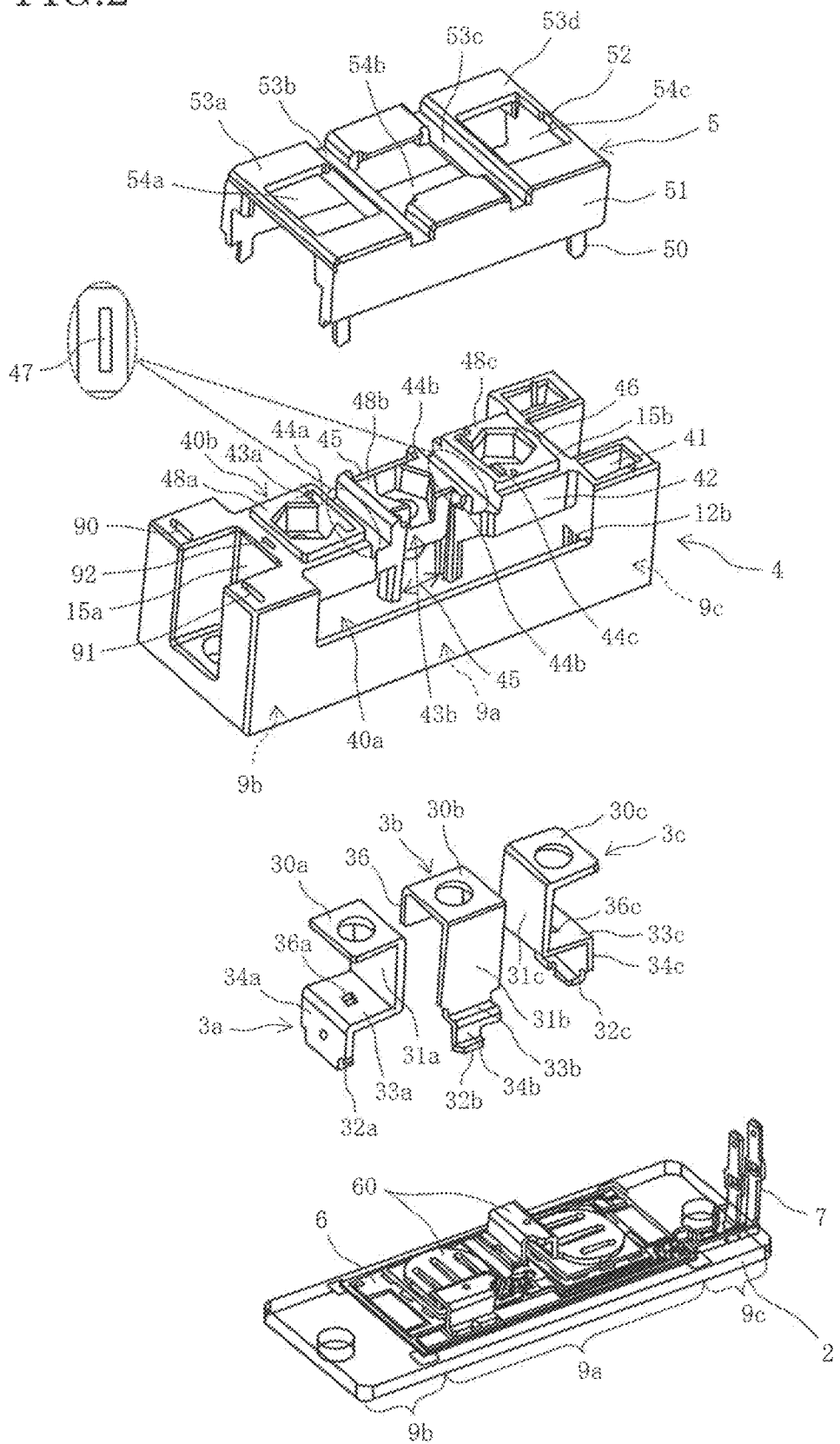
FIG. 2 is an exploded perspective view of the semiconductor module.
Figure 3:
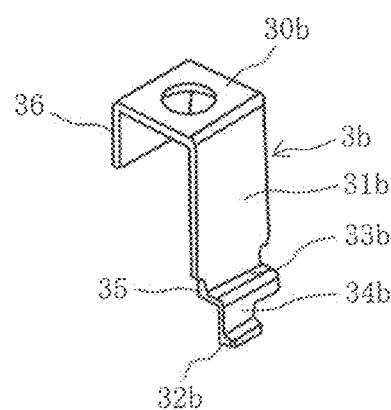
FIG. 3 is a perspective view showing a state in which an external terminal is attached to a case.
Figure 3:
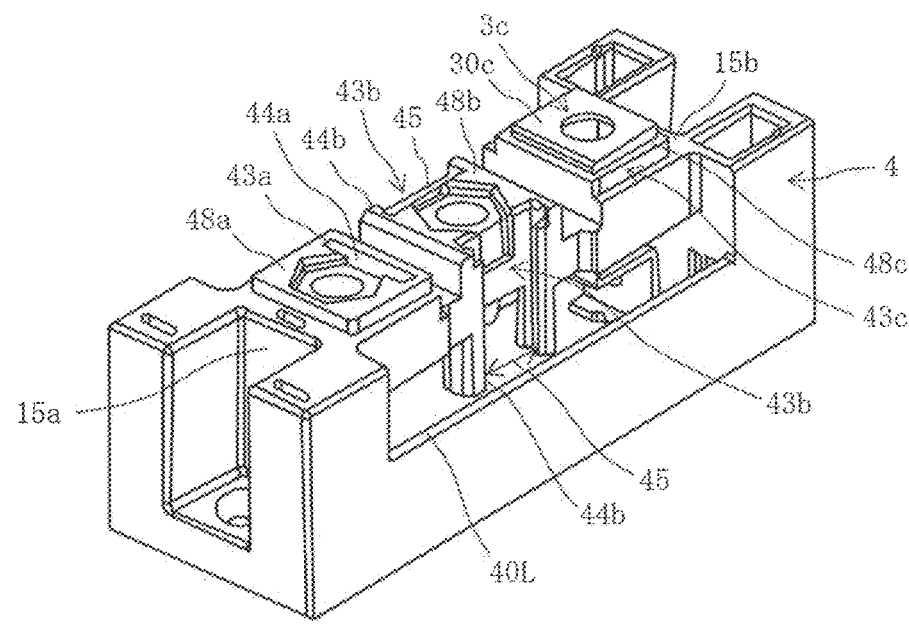
Figure 3:
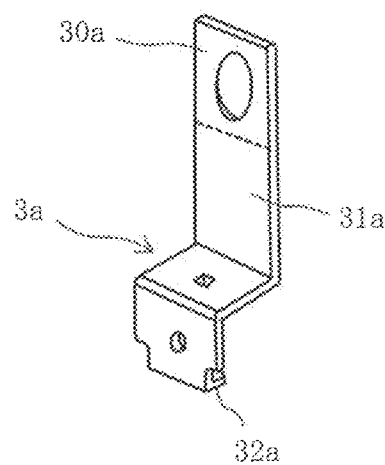
Figure 4:
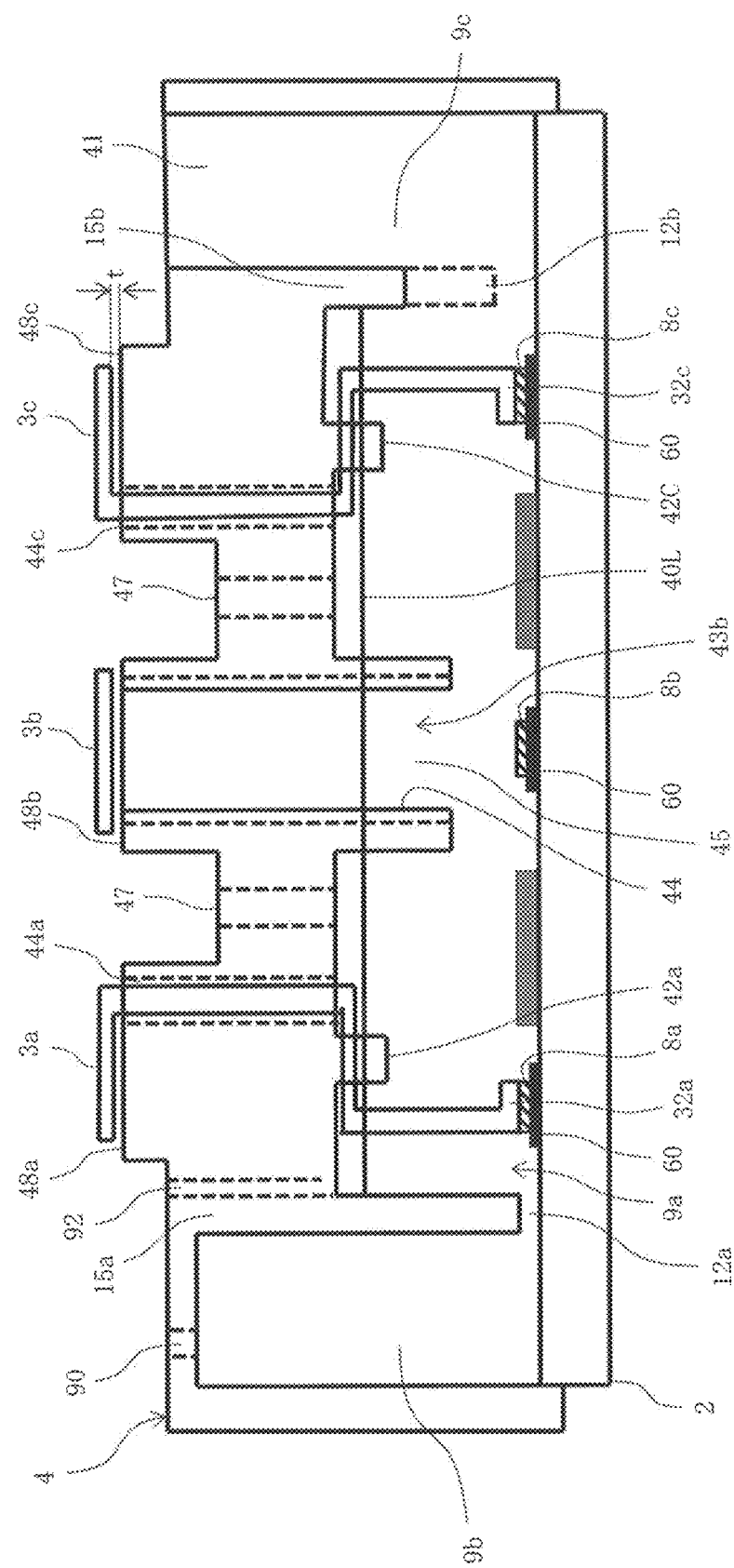
FIG. 4 is a cross-sectional view of the semiconductor module before a reflow soldering process.
Figure 5:
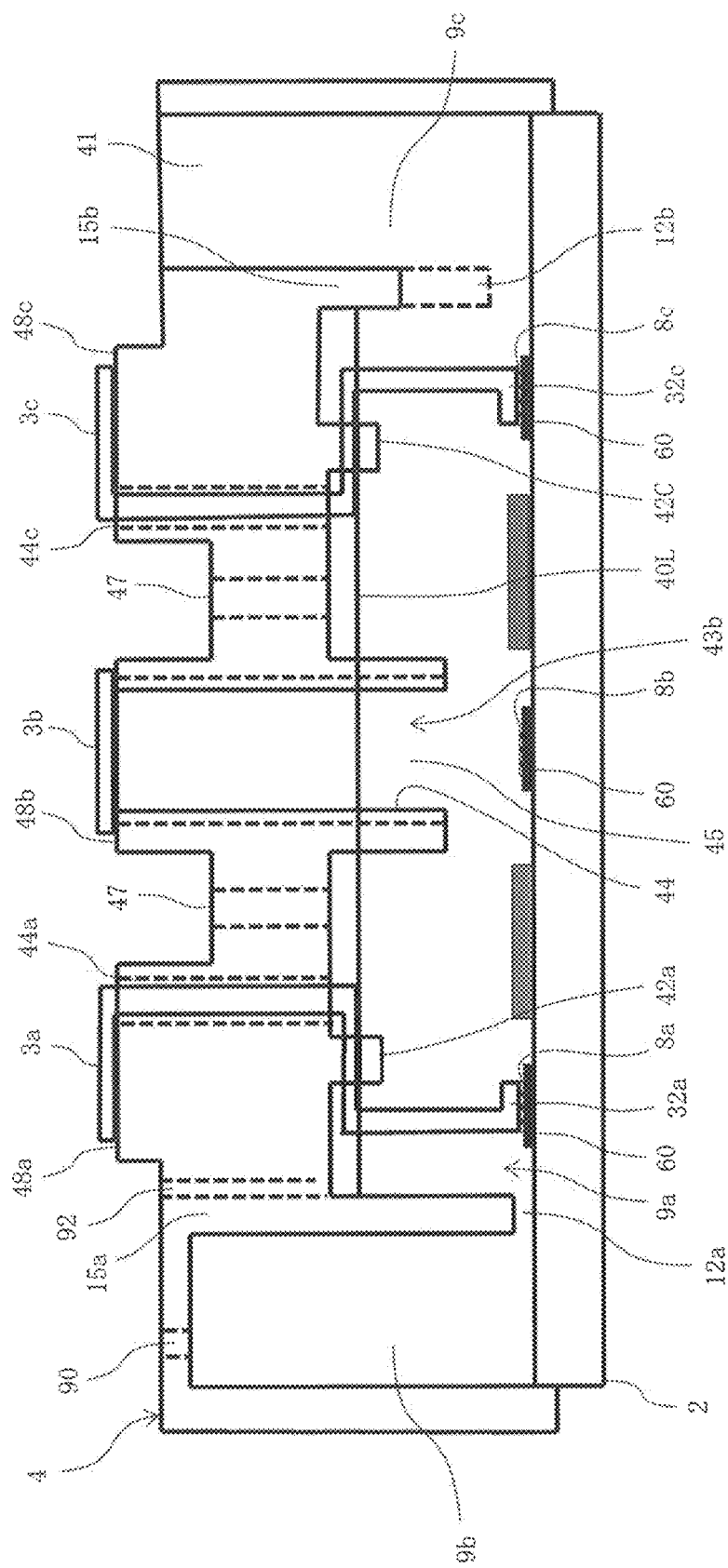
FIG. 5 is a cross-sectional view of the semiconductor module after the reflow soldering process.
Figure 6:
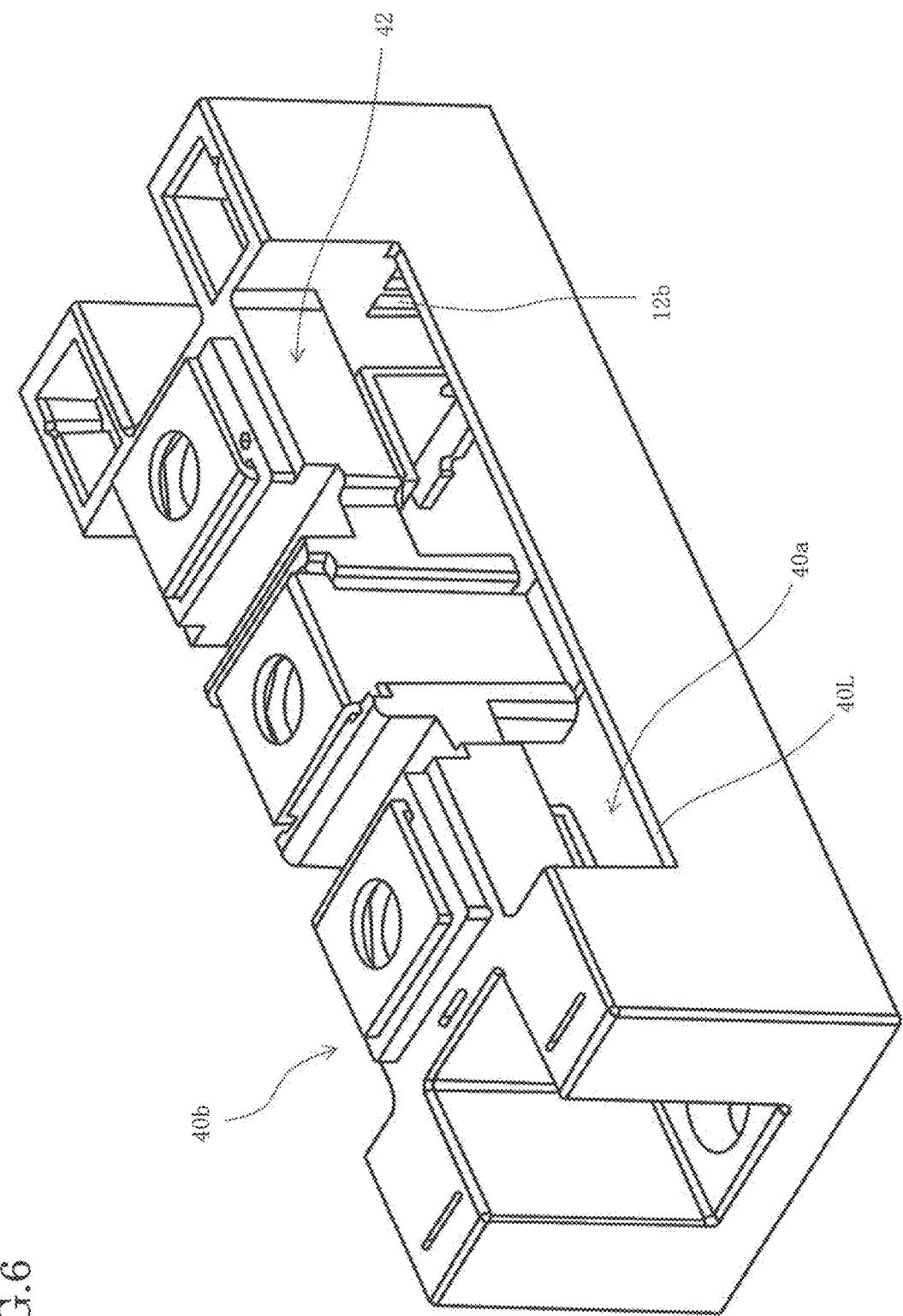
FIG. 6 is a perspective view of the case to which the external terminal has been attached.
Figure 7:
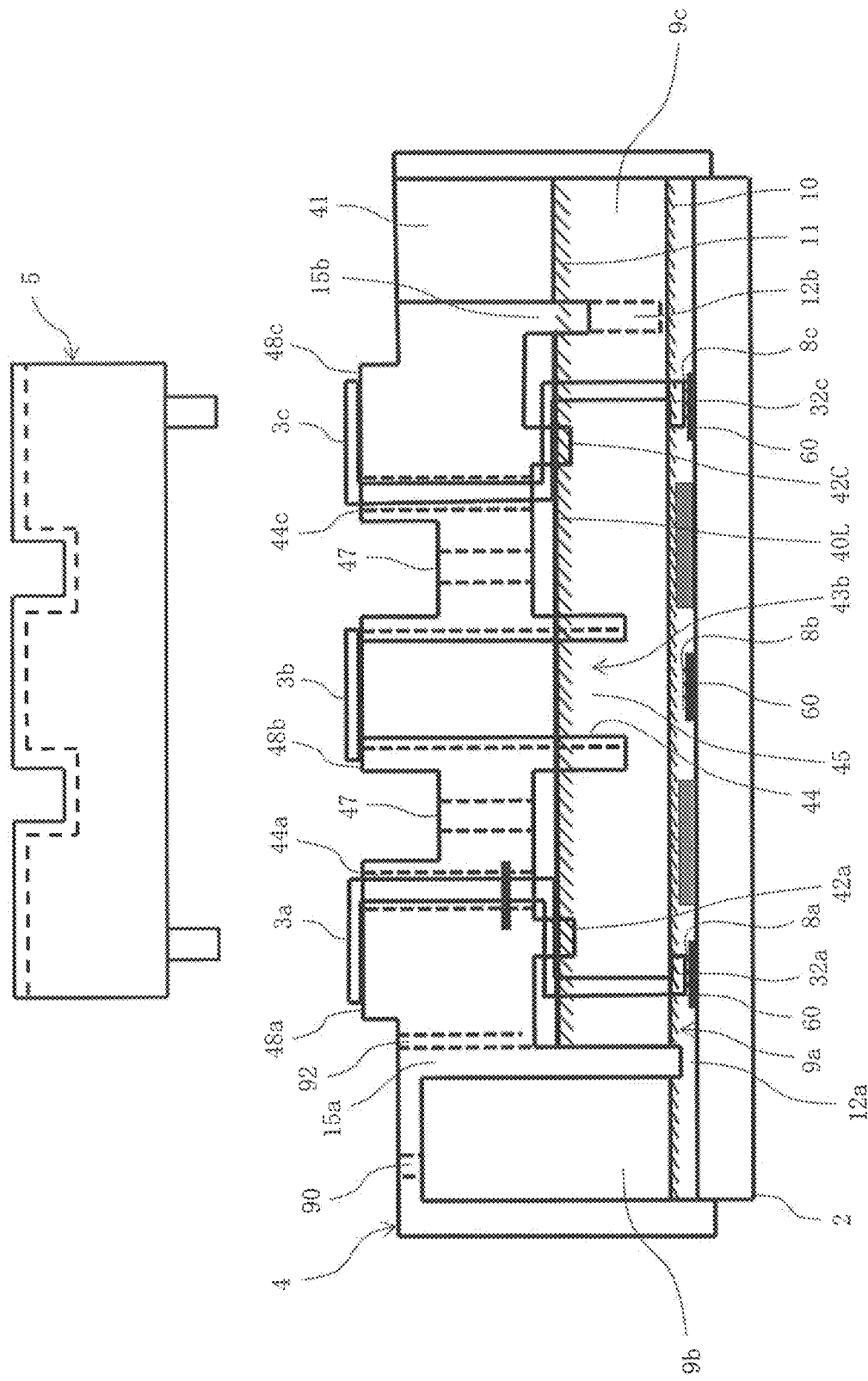
FIG. 7 is a drawing schematically showing an injection amount of silicone gel 10 and an injection amount of epoxy resin 11.

FIG. 1 is a perspective view of a semiconductor module according to an embodiment of the present invention, FIG. 2 is its exploded perspective view, FIG. 3 is a perspective view showing a state in which an external terminal is attached to a case, and FIG. 4 shows a cross-sectional view of the semiconductor module before a reflow soldering process. FIG. 5 shows a cross-sectional view of the semiconductor module after the reflow soldering process. FIG. 6 shows a perspective view of the case to which the external terminal has been attached. FIG. 7 is a drawing schematically showing an injection amount of silicone gel 10 and an injection amount of epoxy resin 11.

In FIG. 1, a semiconductor module 1 is, as a whole, a rectangular parallelepiped in shape, in upper part of which terminal portions 30a-30c, which are upper ends of three external terminals, are exposed. The module 1 includes a metallic base plate 2 (see FIG. 2) located at a lower part thereof; a case 4 consisting of a top face, a front face, a rear face, a left side face and a right side face covering an entire internal part of the module including the base plate 2; and a lid body 5 that is put onto the case 4 from upper side thereof.

As shown in FIG. 4, in this embodiment, the semiconductor module 1 is divided into a central room 9a, a stress absorption room 9b and a gate terminal room 9c.

In the central room 9a, gate terminals as driving terminal, a semiconductor chip, a circuit pattern and so forth are disposed. These are important components that influence the quality as a product. On the left side of the central room 9a, the stress absorption room 9b is disposed. On the right side of the central room 9a, the gate terminal room 9c in which the gate terminals 7 are routed is disposed.

The lid body 5 covers the central room 9a. Between the central room 9a and the stress absorption room 9b, a partition wall 15a is provided. Under the partition wall 15a, a silicon gel inflow port 12a is provided. Between the central room 9a and the gate terminal room 9c, a partition wall 15b is provided. Under the partition wall 15b, a gate terminal port 12b through which the gate terminals are wired is provided. Details of these silicone gel inflow port 12a and gate terminal port 12b will be described later.

The lid body 5 includes, as described later in detail in the production process, a leg portion 50 that is glued in an epoxy resin curing process.

The case 4 and the lid body 5 are formed of a resin material such as PPS (polyphenylene sulfide) that is thermoplastic, eco-friendly, capable of undergoing high temperature curing and has a high thermal conductivity.

In FIG. 2, on the metallic base plate 2, there is placed a ceramic substrate 6 on which a copper circuit pattern is formed and which is for electrical insulation from the base plate. The ceramic substrate 6 is so thin that heat of the ceramic substrate 6 can diffuse readily through the base plate 2. On the ceramic substrate 6, circuit elements including the semiconductor chip for power control, the circuit pattern, internal terminals 60 and so forth are mounted. The semiconductor chip is, for example, a chip for thyristor, diode and/or transistor for power control.

To the ceramic substrate 6, soldering portions 32a-32c which are respective lower ends of three external terminals 3a-3c that are held by the case 4 are soldered. Upper ends of the external terminals 3a-3c are bent to form terminal portions 30a-30c, respectively.

Between the left and right external terminals 3a, 3c and the central external terminal 3b, there is a difference in manner of attachment to the case 4; therefore, these groups of terminals have different shapes.

The external terminals 3a, 3c respectively include: vertical sections 31a, 31c; terminal portions 30a, 30c formed by bending upper parts of these vertical sections 31a, 31c horizontally; horizontal sections 33a, 33c formed by bending the vertical sections 31a, 31c horizontally at positions lower than centers thereof; lower vertical sections 34a, 34c formed by bending the horizontal sections 33a, 33c downward; and soldering portions 32a, 32c formed by bending bottom ends of the lower vertical sections 34a, 34c so as to be used for soldering. Additionally, central parts of the horizontal sections 33a, 33c include rectangular fitting holes 36a, 36c, respectively. At least bottom faces of the horizontal sections 33a, 33c are formed so as to be located at levels not above a height of a case opening lower edge portion 40L (see FIG. 4, FIG. 5) when the soldering portions 32a, 32c are soldered onto the ceramic substrate 6.

The central external terminal 3b includes: a vertical section 31b; a terminal portion 30b formed by bending an upper part of the vertical section 31b horizontally; a horizontal section 33b formed by bending the vertical section 31b horizontally at a position lower than a center thereof; a lower vertical section 34b formed by bending the horizontal section 33b downward; and a soldering portion 32b formed by bending a bottom end of the lower vertical section 34b so as to be used for soldering. The central external terminal 3b also includes a second vertical section 36 formed by bending a rear face's side of the terminal portion 30b downward in such a manner as to face the vertical section 31b.

The lower vertical section 34b is formed by once bending the vertical section 31b toward a front face's side and then bending thereof downward. Thus, a face of the lower vertical section 34b is disposed more to the front face's side than the face of the vertical section 31b. Also, at a lower end of the vertical section 31b between the vertical section 31b and the horizontal section 33b, a narrow width portion 35 (see FIG. 3) a width of which is narrower than that of the vertical section 31b is formed.

As shown in FIG. 4, the case 4 has left and right first and second partition walls 15a, 15b, and with these partition walls 15a, 15b the case 4 is divided into the central room 9a, the stress absorption room 9b and the gate terminal room (driving terminal room) 9c. Under the first partition wall 15a, the silicone gel inflow port 12a is formed, and the central room 9a is communicably connected to the stress absorption room 9b through the silicone gel inflow port 12a. Under the second partition wall 15b, the gate terminal port 12b to rout the gate terminals 7 from the central room 9a to the gate terminal room 9c is formed, and the central room 9a is communicably connected to the gate terminal room 9c through the gate terminal port 12b. The gate terminal port 12b consists of a plurality of projecting portions in a form of comb teeth when viewed from side face thereof so that a plurality of gate terminals 7 can be routed being spaced between each other. Heights of the silicone gel inflow port 12a and the gate terminal port 12b will be described later.

One end portion of the case 4, left side portion thereof in this embodiment, includes the stress absorption room 9b. In a top face or side face of the stress absorption room 9b, or from the top face to the side face thereof, small holes 90, 91 are formed. Also, the other end portion of the case 4, right side portion thereof in this embodiment, includes the gate terminal room (driving terminal room) 9c. In a top face of the gate terminal room 9c, a gate opening 41 is formed. The gate terminals 7 routed through the gate terminal port 12b from the central room 9a is exposed to outside from the gate opening 41. The central room 9a is formed between the stress absorption room 9b and the gate terminal room 9c, and is surrounded by the first and the second partition walls 15a, 15b, and the front face, the rear face and the top face of the case 4.

The case 4 includes a first case opening portion 40a that is formed by cutting off the front face of the case 4 from an upper edge thereof along a longitudinal direction thereof, and a second case opening portion 40b that is formed by cutting off the rear face of the case 4 from an upper edge thereof along the longitudinal direction (see FIG. 2, FIG. 6). These first case opening portion 40a and second case opening portion 40b are set to have a length equal to a distance between the partition walls 15a and 15b in the longitudinal direction. Also, in vertical direction, they are set to have a height equal to a distance from the top face of the case 4 to a case opening lower edge portion 40L.

The above-mentioned external terminal holding portion 42 is located between the first case opening portion 40a and the second case opening portion 40b.

Therefore, when viewed from the top, the case 4 looks as follows:

On the left and right sides, there are the stress absorption room 9b and the gate terminal room 9c, respectively; and in the middle sandwiched in between, there is the central room 9a. Above the central room 9a and on the front face's side and rear face's side thereof, there are the first case opening portion 40a and the second case opening portion 40b, respectively; and between the first case opening portion 40a and the second case opening portion 40b, there is the external terminal holding portion 42 that is I-shaped. From the first case opening portion 40a and the second case opening portion 40b, the case opening lower edge portions 40L can be seen. Further, when the case 4 is viewed from the front face's side, there is the front face of the central room 9a at a position sandwiched between the front faces of the stress absorption room 9b and the gate terminal room 9c. As to the central room 9a, inside thereof can be seen from the first case opening portion 40a and the second case opening portion 40b.

The external terminal holding portion 42 is, on the top face thereof, provided with terminal faces 48a-48c. On the terminal faces 48a-48c, terminal portions 30a-30c of the external terminals are disposed, respectively. Between the terminal faces 48a and 48b, and between the terminal faces 48b and 48c, concave hollows are formed so as to secure insulation by elongating a creepage distance. In these hollows, small holes 47 (see FIG. 4, FIG. 5) are formed. Also in a top face between the terminal face 48a and the first partition wall 15a (stress absorption room 9a), a small hole 92 (see FIG. 4, FIG. 5) is formed. At edge portions of the left and the right terminal faces 48a, 48c, rectangular through holes 44a, 44c through which the vertical sections 31a, 31c are slidable in vertical direction are formed, respectively. Moreover, on faces opposite the terminal faces 48a, 48c of the external terminal holding portion 42, rectangular protrusions 42a, 42c protruding downward are formed, respectively (see FIG. 4). A height of lower ends of the rectangular protrusions 42a, 42c is set to be not higher than the height of the case opening lower edge portion 40L. The left and the right vertical section holding portions 43a, 43c consist of these through holes 44a, 44c and rectangular protrusions 42a, 42c, respectively. In the central vertical section holding portion 43b, an insertion port 45 is formed. The insertion port 45 is formed so as to have a width and a thickness that allow the vertical section 31b of the external terminal 3b to slide in vertical direction with a front face's side of a rectangular through hole being opened. At left and right edge portions of the insertion port 45, guide grooves are formed.

Also on the rear face's side of the case 4, a vertical section holding portion 43b with a rear face being opened is formed similarly. The guide grooves 44b are formed from the top face of the external terminal holding portion 42 to a height not above the height of the case opening lower edge portion 40L. A width of the guide grooves 44b is set to a width that allows the vertical section 31b of the external terminal 3b to slide in vertical direction; and the width of the insertion port 45 is set to be narrower than that of the vertical section 31b and wider than that of the narrow width portion 35. Generally, in the state where the external terminal 3b is bent and the vertical section 31b has the horizontal section 33b, it is impossible for the horizontal section 33b to pass through the insertion port 45. Therefore, it is impossible to attach the vertical section 31b, by inserting thereof, to the vertical section holding portion 43b. However, in this embodiment, since the narrow width portion 35 is formed in the external terminal 3b, it is possible to attach the vertical section 31b to the vertical section holding portion 43b even in the state of the external terminal 3b being bent to the final form. That is, when the narrow width portion 35 is located at a top end of the vertical section holding portion 43b, the part from the narrow width portion 35 downward is in a state of protruding toward the front face's side of the insertion port 45. In this state, when the narrow width portion 35 is inserted from a top of the insertion port 45, the vertical section 31b is inserted into the guide grooves 44b. At this time, since the part from the narrow width portion 35 downward is in the state of protruding toward the front face's side of the insertion port 45, vertical movement of the vertical section 31b is not obstructed. Also, since the width of the vertical section 31b is wider than that of the insertion port 45, the vertical section 31b can be vertically moved along the guide grooves 44b without coming off from a front face of the guide grooves 44b.

Therefore, in the state of the central external terminal 3b with the terminal portion 30b being bent, in other words, with the central external terminal 3b being completed into the final form thereof, the central external terminal 3b can be attached to and held by the vertical section holding portion 43b. When the vertical section 31b is pushed down from the upper side along the guide grooves 44b, near a top part of the external terminal 3b, the second vertical section 36 is inserted into the guide grooves 44b on the rear side. After that, when the vertical section 31b is pushed down further, the terminal portion 30b is brought into contact with the terminal face 48b of the external terminal holding portion 42, then no further downward movement becomes possible. In the state of the vertical section 31b being held by the vertical section holding portion 43b, the vertical section 31b is restrained by the guide grooves 44b from moving in horizontal directions, namely in directions to the front, rear, left and/or right.

Additionally, although the narrow width portion 35 is formed in the lower part of the vertical section 31b in this embodiment, the horizontal section 33b itself may be a narrow width portion 35. Moreover, although the second vertical section 36 and the guide grooves 44b on the rear face's side are provided so as to hold the external terminal 3b firmly and steadily, it is also possible to omit these. Further, although the horizontal section 33b and the lower vertical section 34b are formed in the external terminal 3b, omitting the lower vertical section 34b, it is also possible to use the horizontal section 33b as a narrow width portion 35 and soldering portion 32b.

The external terminals 3a, 3c are formed by forming the horizontal sections 33a, 33c through bending the vertical sections 31a, 31b, by forming, through bending thereof downward, the lower vertical sections 34a, 34c, and then by forming, through bending the bottom portions thereof, the soldering portions 32a, 32c, respectively.

Procedures to attach the external terminals 3a, 3c to the through holes 44a, 44c are explained.

Before the terminal portions 30a, 30c are bent, the vertical sections 31a, 31c being in states of straight lines are inserted into the through holes 44a, 44c from the lower sides thereof and pushed up, respectively.

Then, the fitting holes 36a, 36c of the horizontal sections 33a, 33c of the external terminals 3a, 3c are fitted to the rectangular protrusions 42a, 42c that are provided so as to protrude downward on the faces opposite the terminal faces 48a, 48c, respectively (see FIG. 4). This causes the external terminals 3a, 3c to be held by the vertical section holding portions 43a, 43c, respectively.

In this state, the external terminals 3a, 3c are positioned on the vertical section holding portions 43a, 43c by the rectangular protrusions 42a, 42c and the fitting holes 36a, 36c, respectively, but are not fixed. Then, after the external terminals 3a, 3c are held by the vertical section holding portions 43a, 43c, respectively, the terminal portions 30a, 30c are bent.

In this manner, by fitting the fitting holes 36a, 36c to the rectangular protrusions 42a, 42c, respectively, the external terminals 3a, 3c are restrained from moving in horizontal directions, namely in directions to the front, rear, left and/or right. Although the horizontal sections 33a, 33c and the lower vertical sections 34a, 34c are formed in the external terminals 3a, 3c, it is also possible to use the lower vertical sections 34a, 34c also for the soldering portions 32a, 32c, and thereby to omit the horizontal sections 33a, 33c, respectively.

With the above-mentioned structures, the external terminals 3a, 3c are restrained from moving in horizontal directions by the fitting holes 36a, 36c and the rectangular protrusions 42a, 42c, respectively, whereas the external terminal 3b is restrained from moving in horizontal directions by the guide grooves 44b. On the other hand, these external terminals 3a-3c are positioned without being fixed completely, and the vertical sections 31a-31c thereof are in states of being movable in upward and downward directions by about several millimeters along the vertical section holding portions 43a-43c, respectively. Therefore, when the external terminals 3a-3c that are attached to the case 4 beforehand are placed onto the base plate 2, the external terminals 3a-3c move upward due to weak forces produced when the soldering portions 32a-32c thereof respectively come into contact with the ceramic substrate on the base plate 2; and thus, even if a small amount of error or the like might exist in height direction, such an error can be absorbed. Therefore, problems that the external terminals 3a-3c press the semiconductor chip etc. so hard as to cause the latter to break, the external terminals 3a-3c lean, bend and/or the like can be prevented from occurring.

FIG. 3 shows a state in which the three external terminals 3a-3c are attached to the case 4 in this manner.

Firstly, as to the external terminals 3a, 3c, explanations follow.

In a state before the terminal portions 30a, 30c are bent, the external terminals 3a, 3c are inserted into the through holes 44a, 44c from the lower side, and the rectangular protrusions 42a, 42c are fitted into the fitting holes 36a, 36c, respectively. In this state, the external terminals 3a, 3c are not fixed completely. The external terminals 3a, 3c are caused to be positioned and held by the vertical section holding portions 43a, 43c, respectively, and then the terminal portions 30a, 30c are bent. In this state, the external terminals 3a, 3c are movable in vertical direction with a small force.

Secondly, as to the external terminal 3b, explanations follow.

With the terminal portion 30b being bent, and with the horizontal section 33b toward the front face's side, the narrow width portion 35 of the vertical section 31b is inserted from the top end into the guide grooves 44b of the vertical section holding portion 43b. At this time, the part of the external terminal 3b from the narrow width portion 35 downward is in a state of protruding out of the insertion port 45 toward the front face's side, so that the vertical section 31b is movable in the guide grooves 44b. When the vertical section 31b is pushed down further from the upper side, near the top of the external terminal 3b, the second vertical section 36 is also inserted into the guide grooves 44b on the rear side. By pushing down the vertical section 31b further, the terminal portion 30b is brought into contact with the terminal face 48b to stop descending. In this manner, both of the vertical section 31b on the front face's side and the second vertical section 36 on the rear face's side are held by the guide grooves 44b. That is, with the external terminal 3b being held by the vertical section holding portion 43b, the external terminal 3b is restrained from moving in directions to the front, rear, left and/or right. In this state, the external terminal 3b is also not fixed completely, and is movable in vertical direction with a small force.

In FIG. 3, there are shown a state before the external terminal 3a is inserted into the vertical section holding portion 43a, a state before the external terminal 3b is inserted into the vertical section holding portion 43b, and a state in which the external terminal 3c is inserted into the vertical section holding portion 43c and the terminal portion 30c is bent.

FIG. 4 shows a state in which the three external terminals 3a-3c are attached to the case 4 in the above-mentioned manner.

As shown in FIG. 2, the semiconductor module 1 can also be provided with a lid body 5 to cover the case 4.

The lid body covers the case opening portion 40 formed to the central room 9a of the case 4. In a top face of the lid body 5, creepage portions 53b, 53c are provided in order to ensure the electrical creepage distance between the terminals. The creepage portions 53a-53d are of U-shape protruding downward. The creepage portion 53b has a shape that fits into the hollow between the terminal faces 48a and 48b of the external terminal holding portion 42. The creepage portion 53c has a shape that fits into the hollow between the terminal faces 48a and 48c of the external terminal holding portion 42. The creepage portions 53a, 53d at both the left and the right ends are disposed at both outer sides of the terminal faces 48a, 48b, respectively.

In the top face of the lid body 5, terminal lead-out portions 54a-54c that respectively cause the terminal portions 30a-30c to be exposed when the lid body 5 is put onto the case 4 are formed. Also, on the top face of the lid body 5, numbers representing respective terminals are engraved, thereby specifying a direction to put the lid body 5 onto the case 4. On that account, so as not to have a wrong direction to put the lid body 5 on, it is preferable to form mutually fitting concave portion and convex portion on the external terminal holding portion 42 of the case and on the lid body 5, respectively. As shown in FIG. 2, in this embodiment, a convex portion 46 is provided at a right side part of the terminal face 48c on the right side of the external terminal holding portion 42, and a concave portion 52 is provided in the creepage portion 53d on the right side of the terminal lead-out portion 54c of the lid body 5. When the lid body 5 is put onto the case 4 in the correct direction, the concave portion 52 of the lid body 5 fits to the convex portion 46 of the external terminal holding portion 42. On the other hand, when the lid body 5 is put onto the case 4 in the wrong direction, the concave portion 52 of the lid body 5 does not fit to the convex portion 46 of the external terminal holding portion 42. That is, since the lid body 5 is disposed in the opposite direction, i.e. by an angle of 180 degree, the creepage portion 53a of the lid body 5 in the opposite direction is disposed facing and on the convex portion 46 of the external terminal holding portion 42. As a result, the creepage portion 53a of the lid body 5 hits the convex portion 46, and is lifted on the right side thereof.

With the above-mentioned structure, putting the lid body 5 on in the wrong direction is prevented from occurring.

At each of a front face and a rear face of the lid body 5, a rectangular cover 51 is formed; and a leg portion 50 is formed toward downward at each of positions a little inside at four corners of the covers so as to be able to penetrate to the inside of the front face and the rear face of the case 4. When the lid body 5 is put onto the case 4, the creepage portions 53a, 53d of the lid body 5 are respectively disposed on top faces on the outer sides of the terminal faces 48a, 48c of the external terminal holding portion 42. Also, the creepage portions 53b, 53c respectively fit into hollows between the terminal faces 48a and 48c of the external terminal holding portion 42. Further, the external terminals 3a-3c are respectively led out from the terminal lead-out portions 54a-54c of the lid body 5. As a result, the case opening portion 40 is covered, and enclosed.

Additionally, the leg portion 50 of the lid body 5 in the state where the lid body 5 covers the case 4 is located lower than the case opening lower edge portion 40L. The leg portion 50 is formed with such a length as to reach the same position in height as the position of the lower ends of the rectangular protrusions 42a, 42c.

A lid body of the conventional semiconductor module has had a thin flat shape, so that it has been assembled on the case by lifting the thin side faces with fingers. However, it is hard to lift such a lid body with fingers; and moreover, the lid body even once placed on the case may later move to side directions. In this manner, workability during assembly has been poor.

On the other hand, in this embodiment, because of the cover 51 covering the case opening portion 40, the lid body 5 can be held from lateral directions by the front face and the rear face of the cover 51 having broad areas. Thus, the lid body 5 can be easily held with one hand, and it is also easy to cover the case 4 therewith. Also, since the lid body 5 is put onto the case 4 after the leg portion 50 is inserted inside the central room 9a of the case 4, positional adjustment of the lid body 5 is also easy. The leg portion 50 and the case 4 may be provided with a claw and a concave portion, respectively, in order to fit to each other. Further, in the case 4, a guide groove along the leg portion may be provided so as to be able to guide the leg portion to a fixed position of the case. By doing so, the positional adjustment of the lid body 5 to the case 4 becomes easier, and thus work efficiency improves.

As described later, before the case opening portion 40 is covered with the lid body 5, filling and curing of gel such as silicone gel and/or resin such as epoxy resin which are sealing materials are carried out. This ensures that the central room 9a, the stress absorption room 9b, and the gate terminal room 9c are sealed, and thereby none of the circuit elements such as semiconductor chip and the circuit pattern is exposed to outside. Therefore, the lid body 5 is not anything that affects the function of the semiconductor module, so that it is not necessarily required. However, in the case of this embodiment, because the external terminal holding portion 42 bridges cavities on both left and right sides thereof over a cavity in the state where merely sealing with the sealing materials has been carried out, it does not have a sufficient strength. However, by the lid body 5, the external terminal holding portion 42 can be reinforced. Also, the lid body 5 prevents dust and/or dirt from entering into the vacancy above the sealing material.

Subsequently, a production process of the semiconductor module is explained.

In FIG. 2, the ceramic substrate 6, the semiconductor chip, and the internal terminal 60 are placed at predetermined positions on the base plate 2. On the ceramic substrate 6, on the semiconductor chip and on the internal terminal 60, solder paste and/or electrically conductive adhesive that is used in soldering by being melted in a subsequent reflow soldering process is coated. At this time, also onto top faces of the internal terminals 60, solder paste 8a, 8b, 8c to solder the soldering portions 32a-32c of the external terminals 3a-3c (see FIG. 4) are coated, respectively.

As explained referring to FIG. 3, following the above-mentioned procedures, the external terminals 3a-3c are attached to the case 4. Further, at this time, the respective three external terminals 3a-3c are not completely fixed, and are movable a little in vertical direction. That is, although the vertical sections 31a-31c are restrained from moving to the front, rear, left and/or right by the vertical section holding portions 43a-43c, respectively, they are movable a little in vertical direction.

Then, in FIG. 4, a thermosetting adhesive is coated onto the base 2, and it is covered with the case 4. In FIG. 4, the lower side from the vertical section 31b downward of the external terminal 3b is omitted.

As shown in FIG. 4, when the case 4 is put on with the soldering portions 32a-32c being disposed on the solder paste 8a-8c, the soldering portions 32a-32c are pushed upward by the solder paste 8a-8c, and the external terminals 3a-3c move upward by a length t, respectively. With this length t, positions of the external terminals 3a-3c in vertical direction are adjusted, thereby absorbing errors. Here, thickness of the solder paste 8a-8c is approximately in a range of 300 μm-500 μm. Onto the solder paste 8a-8c, own weights of the external terminals 3a-3c are respectively applied, and when the case 4 is put on the base plate 2, the positions of the external terminals 3a-3c are determined by their own weights.

With a conventional structure, the case 4 is put on the base plate 2 after the external terminals 3a-3c are completely fixed. However, with this conventional structure, problems arise if there is any error in the height of the external terminals 3a-3c. That is, the soldering portions 32a-32c may not reach the solder paste 8a-8c, thereby causing a poor connection. The semiconductor chip may be pressed hard through the solder paste 8a-8c by the external terminals 3a-3c, thereby being cracked. Additionally, the external terminals 3a-3c themselves may lean and/or be distorted. On the other hand, in this embodiment, firstly, the external terminals 3a-3c are attached to the case 4 in such a manner as to be movable in vertical direction. Secondly, when the case 4 is put on the base plate 2, the external terminals 3a-3c that have moved downward by their own weights rise by the length t. At this time, the soldering portions 32a-32c of the external terminals 3a-3c surely touch the solder paste 8a-8c, respectively. That is, positional adjustment in vertical direction of the external terminals 3a-3c can be carried out automatically. Also, the external terminals 3a-3c can prevent problems such as breaking of the semiconductor chip and/or buckling of the external terminals from occurring.

Next, the semiconductor module as a whole is moved to the reflow soldering process, where the soldering process is carries out.

In this process, soldering of each element is carried out with the solder paste being melted, and simultaneously, the case 4 is joined and fixed to the base 2.

In FIG. 4, the solder paste 8a-8c melt; as a result, the external terminals 3a-3c descend by their own weights. The external terminals 3a-3c descend by an amount of t-alpha, taking a height of the solder bonding layer as alpha. At this time, the external terminals 3a-3c, being restrained from moving in horizontal directions by the vertical section holding portions 43a-43c, respectively, do not shift in horizontal directions. As a result, the soldering portions 32a-32c are soldered onto the ceramic substrate 6, and thereby the external terminals 3a-3c are respectively fixed to the predetermined positions as in FIG. 5. In this manner, the external terminals 3a-3c are accurately attached to the predetermined positions. Additionally, since the terminal portions 30a-30c are attached to the case 4 and bent beforehand before the soldering, there is no occurrence of problems that have occurred conventionally such as detachment and/or contact failure of the soldered portion due to the stress produced when bending is carried out after the soldering.

As stated above, with the structure of the semiconductor module of this embodiment, the external terminals 3a-3c are attached to the base plate 2 with high accuracy.

Subsequently, the semiconductor module in the state of FIG. 5 after the soldering is completed is cleaned with an ultrasonic cleaning machine or the like.

As aforementioned, in the external terminal holding portion 42, the holes 47 are formed between the terminal faces 48a and 48b, and between the terminal faces 48b and 48c, and the small hole 92 is formed in the top face between the terminal face 48a and the stress absorption room 9b. Also, in the top face of the gate terminal room 9c, the gate opening 41 is open. In the cleaning process, most part of the cleaning liquid is introduced and drained from the case opening portion 40 (the first case opening portion 40a, the second case opening portion 40b) of the central room 9a; and cleaning liquid also circulates to the stress absorption room 9b and the gate terminal room 9c through the silicone gel inflow port 12a and the gate terminal port 12b, respectively. In addition, the cleaning liquid flows into the inside of the case 4 also through the holes 47, the small hole 92 and the gate opening 41, so that the cleaning liquid is smoothly circulated inside the case by convection to every corner.

In the semiconductor module of this embodiment, as shown in FIG. 5, the case 4 is provided with the stress absorption room 9b at one side part (left side of FIG. 5). In this case where silicone gel is used to seal the substrate, the stress absorption room 9b has, as described later, a sufficiently large space portion not less than an amount of a volume expansion caused by the thermal stress of the silicone gel. Also, the stress absorption room 9b includes the small holes 90, 91 in the top face, as stated above (see FIG. 2).

In a drying process after the cleaning process, when the case 4 is turned upside down, the cleaning liquid inside the case 4 is drained from the case opening portion 40 and the small hole 92. The cleaning liquid inside the gate terminal room 9b is drained from the large gate opening 41 in the top face, and also drained from the case opening portion 40 of the central room 9a through the gate terminal port 12b. The cleaning liquid inside the stress absorption room 9b is drained from the small holes 90, 91 formed in the top face, and also drained from the case opening portion 40 of the central room 9a through the silicone gel inflow port 12b. The small holes 90, 91 of the stress absorption room 9b may be formed in other faces than the top face, for example in the side face; or a hole in a smaller shape of the case opening portion 40 may be formed from the top face to the side face. When the holes 90, 91 are formed at positions that become a lower side of the case 4 in the drying process, drying can be carried out most efficiently. If there remains any cleaning liquid in the stress absorption room 9b, in a curing process of the silicone gel that is to be injected subsequently, the phenomenon of inability to become completely cured (curing inhibition) occurs. When the cleaning process is finished, an inspection process consisting of visual inspection and electrical properties inspection of the semiconductor module is entered.

In the visual inspection process, checking to see if the soldering is complete, including checking of conformability of solder, terminal positions and so forth, is carried out by operator's visual observation. The visual observation is carried out by looking inside from the case opening portion 40 of FIG. 6. The case opening portion 40 (the first case opening portion 40a, the second case opening portion 40b) is formed by cutting off the front face and the rear face of the case 4 in such a manner as to be open from the upper edge of the case 4 downward to the case opening lower edge portion 40L in vertical direction, and between the first and the second partition walls 15a and 15b in the longitudinal direction. Thus, the case opening portion 40 has a sufficient opening area for visual observation. Therefore, in normal position, it is possible to see inside from the case opening portion 40, and to easily make a decision as to whether there is any soldering failure and/or the like by visual check. Further, the holes 47 formed in the top face of the external terminal holding portion 42 can add to the area for external light intake at the time of visual observation. Thus, sufficient amount of light reaches the inside from both sides of the front face and the rear face of the case 4, so that soldering state on the substrate and so forth can be easily checked. Also, since it is made possible to perform the visual inspection after the soldering is finished, there is no need to make a failure decision after the electrical properties check is performed as in conventional practices. That is, in an early stage before the electrical inspection, it is possible to remove defective products surely by determining the defective products such as solder conformability failure, terminal position shift and/or the like.

After the inspection process is finished, a substrate sealing process is entered.

In this embodiment, silicone gel 10 and epoxy resin 11 are used as sealing material. The silicone gel 10 has a lower viscosity than the epoxy resin 11. As a result, the silicone gel 10 penetrates well into the case 4 while being injected; and also the silicone gel 10 is hardly detached from the substrate while undergoing the thermal cycle. Hence, the silicone gel 10 is injected and cured, and then sealing using the epoxy resin 11 is carried out. In the substrate sealing process, first, the silicone gel 10 is injected from the case opening portion 40 (the first case opening portion 40a, the second case opening portion 40b) of the semiconductor module 1 of FIG. 6 onto the ceramic substrate 6 disposed in the central room 9a; then the silicone gel 10 also flows from the central room 9a into the stress absorption room 9b and the gate terminal room 9c through the silicone gel inflow port 12a and the gate terminal port 12b, respectively. After that, the silicone gel 10 is cured by heating. Subsequently, as described later, the epoxy resin 11 is injected, and is cured by heating. FIG. 7 schematically shows an injection amount of the silicone gel 10 and an injection amount of the epoxy resin 11.

Here, in the semiconductor module of this embodiment, as shown in FIG. 7, the height of the silicone gel inflow port 12a provided under the first partition wall 15a is set to be lower than the height of upper faces of the soldering portions 32a-32c of the external terminals 3a-3c that have been soldered onto the ceramic substrate 6. The gate terminal port 12b provided under the second partition wall 15b between the central room 9a and the gate terminal room 9c is for leading the gate terminals 7 out from the central room 9a; and the height of the gate terminal port 12b is set to be higher than that of the silicone gel inflow port 12a, and at about the same height as the height of the horizontal sections 33a, 33b of the external terminals 3a, 3c. In other words, injection amount of the silicone gel 10 is set to be about an amount with which up to the upper faces of the soldering portions 32a-32c of the external terminals 3a-3b are embedded; and the height of the silicone gel inflow port 12a is set to be lower than that of a top face of the silicone gel 10. Thus, as in FIG. 7, when the silicone gel 10 is injected, the silicone gel inflow port 12a is embedded in the silicone gel 10. The height of the top face of the silicone gel 10 is higher than that of the silicone gel inflow port 12a, and comes to a height not lower than that of the top faces of the soldering portions 32a-32c of the external terminals 3a-3c. At this time, since the height of the gate terminal port 12b is higher than that of the silicone gel 10, the gate terminal port 12b is in a state of not being embedded.

After the injection of the silicone gel 10, the silicone gel 10 is cured by heating. A gas generated during the curing is discharged, in the central room 9a, from the case opening 40 and the small hole 92. The gas is discharged, in the gate terminal room 9c, from the gate opening 41. Since the central room 9a and the gate terminal room 9b are communicably connected to each other above the silicone gel 10 at the gate terminal port 12b, the gas is also discharged from the case opening portion 40 (the first case opening portion 40a, the second case opening portion 40b).

Now that the silicone gel inflow port 12a is embedded in the silicone gel 10, the central room 9a and the stress absorption room 9b are isolated from each other by the first partition wall 15a and the silicone gel 10, and hence the stress absorption room 9b has become an independent room. The gas generated in the stress absorption room 9b during the curing is discharged from the small holes 90, 91, so that there is no possibility that any portion of it remains inside the case 4. In this manner, not only are the small holes 90, 91 that are formed in the stress absorption room 9b used in the cleaning-drying process, but also they are used in the sealing process.

Subsequently, when the epoxy resin 11 is injected from the case opening portion 40 (the first case opening portion 40a, the second case opening portion 40b) into the central room 9a by an appropriate amount as in the case of the silicone gel 10, the epoxy resin 11 spreads over the silicone gel 10, and also flows from the central room 9a into the gate terminal room 9c through the gate terminal port 12b. However, as stated above, since the silicone gel inflow port 12a is embedded in the silicone gel 10, the epoxy resin does not flow into the stress absorption room 9b. Injection amount of the epoxy resin 11, in this embodiment, is an amount that results in a height not higher than the case opening lower edge portion 40L to the extent that the epoxy resin 11 does not spill down from the case opening portion 40; and in this embodiment, the height is set to a height up to the bottom faces of the horizontal sections 33a, 33c of the external terminals 3a, 3c. Here, the injection amount of the epoxy resin 11 may be an amount that results in a height to cover up the horizontal sections 33a, 33c.

After the epoxy resin 11 is injected, the case 4 is covered with the lid body 5 before the resin hardens.

By causing the leg portion 50 of the lid body 5 to descend along inner face of the case opening portion 40 (the first case opening portion 40a, the second case opening portion 40b) of the case 4, the creepage portions 53b, 53c of the lid body 5 that are convex downward are fit into the hollows between the terminal faces 48a and 48b, and the terminal faces 48a and 48c of the external terminal holding portion 42, respectively, and thereby the holes 47 formed in the hollows of the external terminal holding portion 42 are blocked by the creepage portions 53b, 53c. At the same time, the creepage portions 53a, 53d on both the left and the right ends of the lid body 5 cover both outer sides of the terminal faces 48a and 48c of the external terminal holding portion 42, respectively, and the hole 92 is blocked by the creepage portion 53a. At this time, since the convex portion 46 of the external terminal holding portion 42 and the concave portion 52 of the cover 5 are coupled, the lid body 5 is put on the top face of the case 4 flat. When the lid body 5 is put on, the terminal portions 30*a*-30*c* of the external terminals 3*a*-3*c* are brought to a state of being exposed from the terminal lead-out portions 54*a*-54*c*, respectively.

In this manner, when the case 4 is covered with the lid body 5, the case opening portion 40 is completely covered with the covers 51, and thus the central room 9*a* is brought to a state of being enclosed. When the case 4 is covered with the lid body 5, the lower end of the leg portion 50 is located at about the same height as the horizontal sections 33*a*, 33*c* of the external terminals 3*a*, 3*c*. Additionally, the lower ends of the rectangular protrusions 42*a*, 42*c* that are respectively inserted into the fitting holes 36*a*, 36*c* of the horizontal sections 33*a*, 33*c* are also at about the same height as the lower end of the leg portion 50. Also, the guide groove 44*b* of the vertical section holding portion 43*b* is formed to the height lower than the case opening lower edge portion 40L, and the lower end of the guide groove 44*b* is at the height lower than the horizontal sections 33*a*, 33*c*. For this reason, the lower ends of the leg portions 50 of the lid body 5, the lower ends of the rectangular protrusions 42*a*, 42*c* of the external terminal holding portions 42 in the state of being inserted into the fitting holes 36*a*, 36*c* of the external terminals 3*a*, 3*c*, and the lower parts of the guide grooves 44*b* are brought to a state of being soaked in the epoxy resin 11.

The epoxy resin 11 is cured, by heating after the lid body 5 (see FIG. 2) is put onto the case 4. By curing the epoxy resin 11, the central room 9*a* and the gate terminal room 9*c* are sealed. At this time, since the epoxy resin 11 is injected up to the lower ends of the leg portions 50 respectively provided at four corners at the lower part of the lid body 5, the leg portions 50 are joined to the case 4 as the epoxy resin 11 is cured. Since the lower ends of the rectangular protrusions 42*a*, 42*c* are also integrated with the epoxy resin 11 that has been cured, the external terminals 3*a*, 3*c* are fixed; and the lower parts of the guide grooves 44*b* are also integrated with the epoxy resin 11 that has been cured, a lower part of the insertion port 45 is covered up, and thus the external terminal 3*b* is fixed. Since the external terminals 3*a*-3*c* are completely fixed in this manner, problems such as detachment of soldered portions resulting from looseness of the external terminals and/or the like can be prevented from occurring.

Further, also in the gate terminal room 9*c*, because lower parts of the gate terminals 7 are fixed by the epoxy resin 11 and the gate terminal port 12*b* in the form of comb teeth is integrated with the epoxy resin 11 under the second partition wall 15*b*, at the same time when the gate terminal room 9*c* is sealed, the gate terminals 7 are also fixed. With this embodiment, since the lid body 5 can also be joined to the case 4 in the process of sealing the inside of the case 4, not only can reduction of the process be achieved but also other components such as adhesives and so forth can be reduced.

In this manner, a circuit main body such as the semiconductor chip inside the central room 9*a* and the gate terminals are embedded in and fixed by the epoxy resin 11, and thus can be prevented from being interfered from outside. Also, the stress absorption room 9*b* is filled with the silicone gel 10, and thus can be prevented from being interfered from outside in the same manner.

In this manner, not only are the stress absorption room 9*b*, the central room 9*a* and the gate terminal room 9*c* sealed by the silicone gel 10 and epoxy resin 11 which is sealing material, the three rooms can be divided into each isolated independent room with the sealing material. Therefore, even the dust and/or dirt entering into the stress absorption room 9*b* from the holes 90, 91 never moves into the neighboring central room 9*a*; and the stress absorption room 9*b* itself, with a face of the base plate 2 therein being sealed by the silicone gel which is sealing material, is not influenced by the dust and/or dirt, either. In the same manner, the gate terminal room 9*c*, with a face of the base plate 2 therein being sealed by the epoxy resin which is sealing material, is not influenced by the dust and/or dirt, either, nor negatively affect the neighboring central room 9*a*.

In this embodiment, although both the silicone gel 10 and the epoxy resin 11 are used as sealing material, the sealing material may be either one of them; or other sealing materials can be used. Because failures such as electrical short circuit and/or the like of the semiconductor module 1 caused by dust and/or dirt can be prevented by the sealing material, even the one without the lid body 5 can be used as a product. However, in this embodiment, since the external terminal holding portion 42 is exposed with cavities at the left and right sides and the underside thereof at the part of the top face of the central room 9*a*, strength of the external terminal holding portion 42 is not strong enough. Then, as in this embodiment, by enclosing the central room 9*a* of the semiconductor module 1 through covering the case 4 with the lid body 5, the left and right sides of the external terminal holding portion 42 are reinforced; and thereby safety of the semiconductor module 1 can be increased. Also, dust and/or dirt can be prevented from entering from outside onto the epoxy resin 11 inside the semiconductor module 1. Therefore, it is possible to reinforce the external terminal holding portion 42 for which an amount of the resin is small, and also to keep up its appearance.

Further, in FIG. 7, although a thermal expansion stress is generated in the silicone gel 10 when the substrate undergoes a thermal stress while the module is used, since the silicone gel 10 can expand in the stress absorption room 9*b*, no physical change occurs in the silicone gel 10 itself at a substrate sealing part, or at an interface between the silicone gel 10 and the substrate. For this reason, there is no possibility that a phenomenon such as formation of a crack in the case 4 that arises from the expansion of the gel, detachment arising from deterioration of the state of joining at the interface between the silicone gel 10 and the substrate, or the like occurs.

After the above-mentioned processes, and after finishing a final inspection process including final visual observation and electrical properties inspection, the semiconductor module of FIG. 1 is completed.

In this embodiment, the vertical section holding portion 43*b* in the middle of the case 4 consists of the insertion port 45 that is opened on the front face's side of the through hole, and the guide grooves formed leaving the left and right sides of the insertion port 45. Also, in the central external terminal 3*b*, there are formed the vertical section 31*b* that is inserted into the guide grooves 44*b*, and the narrow width portion 35 that protrudes from the insertion port 45. Therefore, the central external terminal 3*b* can be inserted into the vertical section holding portion 43*b* from the upper side even after the terminal portion 30*b* has been formed by bending. Since the terminal portion 30*b* can be bent beforehand in this manner, workability is excellent. On the other hand, as to the left and the right external terminals 3*a*, 3*c*, since the vertical section holding portions 43*a*, 43*c* on the left and the right sides of the case 4 are constituted by the through holes 44*a*, 44*c*, respectively, it is necessary to form the terminal portions 30*a*, 30*c* by bending after the vertical sections 31*a*, 31*c* are, in their straight shapes, inserted into, positioned, and held by the through holes 44*a*, 44*c*, respectively. On that account, from the standpoint of workability, these vertical section holding portions 43a, 43c may also have a structure similar to the vertical section holding portion 43b, and the external terminals 3a, 3c may also have the same shape as the external terminal 3b.

REFERENCE SIGNS LIST 1 semiconductor module
2 base plate
3(3a, 3b, 3c) external terminal
4 case
5 lid body
6 ceramic substrate
7 gate terminal
9a central room
9b stress absorption room
9c gate terminal room
40 case opening portion

The invention claimed is:

1. A semiconductor module comprising:
a rectangular base plate;
a substrate which is placed on the base plate and on which a circuit that includes a driving terminal to drive a semiconductor chip and the semiconductor chip is formed;
a rectangular parallelepiped case made of resin that is attached to the base plate and houses the substrate within; and
a plurality of external terminals lower ends of which are fixed to the substrate with upper ends thereof being exposed on a top face of the case, wherein
the case includes:
    a first case opening portion that is formed by cutting off a front face of the case from an upper edge thereof along a longitudinal direction thereof;
    a second case opening portion that is formed by cutting off a rear face of the case from an upper edge thereof along the longitudinal direction;
    an external terminal holding portion that is provided in the top face of the case between the first case opening portion and the second case opening portion and holds the plurality of external terminals along the longitudinal direction with the upper ends thereof being exposed; and
    a sealing material having been injected from the first case opening portion or the second case opening portion onto a top face of the substrate.

2. The semiconductor module according to claim 1, wherein the sealing material includes either one of gel and resin, or both thereof.

3. The semiconductor module according to claim 1, wherein
the case includes:
    a central room in which the substrate is included;
    a stress absorption room having a space portion not less than an amount of a volume expansion caused by a thermal stress of the sealing material at a first side portion located at either one of left side and right side of the central room; and
    a driving terminal room in which the driving terminal is routed at a second side portion located at the other one of the left side and the right side of the central room.

4. The semiconductor module according to claim 3, wherein the stress absorption room includes a small hole formed in a top face or side face thereof, or from the top face to the side face thereof; and the driving terminal room includes a terminal opening to lead the driving terminal to outside of the case.

5. The semiconductor module according to claim 3, wherein the first case opening portion, the second case opening portion and the external terminal holding portion are included in the central room of the case.

6. The semiconductor module according to claim 1 further comprising:
a lid body that covers the case, wherein
the lid body includes:
    a top face in which a terminal lead-out portion from which the plurality of the external terminals are each exposed is formed; and
    a cover that covers each of the first case opening portion and the second case opening portion from the top face downward.

7. The semiconductor module according to claim 6, wherein the lid body includes, at a lower part of the cover, a leg portion that reaches the sealing material.

8. The semiconductor module according to claim 6, wherein a part of the external terminal holding portion includes a first concave portion or a first convex portion; and a part of the lid body includes a second convex portion or a second concave portion that is coupled with the first concave portion or the first convex portion.

9. The semiconductor module according to claim 1, wherein
the external terminal includes a first vertical section provided between the upper end and the lower end;
the external terminal holding portion includes a first vertical section holding portion that restrains the first vertical section of the external terminal from moving in horizontal directions and slidingly guide thereof in vertical direction; and
the external terminal, in a state before the case is attached to the base plate, is movable in vertical direction and is restrained from moving in horizontal directions through the external terminal holding portion.

10. The semiconductor module according to claim 9, wherein
the external terminal has a narrow width portion which is formed continuously next to the first vertical section and a width of which is narrower than a width of the first vertical section;
the first vertical section holding portion has an insertion port formed by opening a face of a through hole, and first guide grooves formed on both left and right sides of the insertion port; and
a width between the first guide grooves has a width between which the first vertical section of the external terminal can be slidingly guided, and a width of the insertion port has a width that is narrower than the width of the first vertical section but not narrower than that of the narrow width portion.

11. The semiconductor module according to claim 10, wherein the narrow width portion is formed between the first vertical section and the lower end of the external terminal.

12. The semiconductor module according to claim 10, wherein
the external terminal holding portion has a terminal face on which the upper end of the external terminal is exposed; and
the external terminal has a terminal portion formed by bending the upper end of the first vertical section, and the terminal portion is disposed along the terminal face.

13. The semiconductor module according to claim 12, wherein
the external terminal has a second vertical section formed by bending the terminal portion in vertical direction in such a manner as to face the first vertical section;
the external terminal holding portion includes a second vertical section holding portion that restrains the second vertical section from moving in horizontal directions and slidingly guide thereof in vertical direction; and
the second vertical section holding portion includes second guide grooves with a width between which the second vertical section can be slidingly guided.

14. The semiconductor module according to claim 9, wherein
the external terminal includes a rectangular hole in a horizontal section formed with the first vertical section being bent; the external terminal holding portion includes a rectangular protrusion inside the case, and
the rectangular protrusion engages with the rectangular hole when the first vertical section of the external terminal is inserted into the vertical section holding portion, and thereby the external terminal is held by the external terminal holding portion.

15. The semiconductor module according to claim 1, wherein
the case includes:
a first partition wall formed in vertical direction inside the case; and
a central room and a stress absorption room divided by the first partition wall, wherein
the substrate is disposed in the central room; and
the stress absorption room includes a space portion not less than an amount of a volume expansion caused by a thermal stress of the sealing material, and a small hole that is provided at an upper part and communicably connected to outside.

16. The semiconductor module according to claim 15, wherein
the case includes a sealing material inflow port formed under the first partition wall; and
a height of the sealing material inflow port is lower than a height of a layer formed with the sealing material.

17. The semiconductor module according to claim 1, wherein
a terminal portion is formed at the upper end of each external terminal of the plurality of external terminals;
the external terminal holding portion includes: a plurality of terminal faces on each of which the terminal portion of each external terminal is disposed; and a plurality of domains formed between neighboring terminal faces of the plurality of terminal faces, wherein at least one domain of the plurality of domains includes a small hole.

18. The semiconductor module according to claim 15, wherein
the case includes:
a second partition wall formed in vertical direction inside the case; and
a driving terminal room divided from the central room by the second partition wall, wherein
the driving terminal is rooted inside the driving terminal room; and the driving terminal room further includes a driving terminal opening to cause the driving terminal to be exposed to outside.

19. The semiconductor module according to claim 18, wherein
the case includes a driving terminal port which is formed under the second partition wall and through which the driving terminal is routed; and
a height of the driving terminal port is higher than that of a layer formed with the sealing material.

20. The semiconductor module according to claim 15 comprising an insulation sealing layer that covers an upper part of the sealing material.

* * * * *